United States Patent [19]

Mutch et al.

[11] Patent Number: 5,227,668

[45] Date of Patent: Jul. 13, 1993

[54] METER TAMPERING DETECTOR

[76] Inventors: Alan J. Mutch, 45 Elvington Road, Hightown, Merseyside; Raymond Sheldon, 15 Seymour Dr., Lydiate, Merseyside, both of England

[21] Appl. No.: 447,072

[22] Filed: Dec. 7, 1989

[30] Foreign Application Priority Data

Dec. 7, 1988 [GB] United Kingdom ............ 8828553

[51] Int. Cl.$^5$ .................................. G01R 11/24
[52] U.S. Cl. .................................. 307/131; 324/110
[58] Field of Search .................... 307/12, 39, 116, 119, 307/120, 125–131; 361/42, 44, 45, 64, 66, 68, 69, 79, 86, 87, 80, 81, 93, 170, 187; 340/637, 870.09; 324/110, 157

[56] References Cited

U.S. PATENT DOCUMENTS

| 4,240,030 | 12/1980 | Bateman et al. | 324/110 |
| 4,331,915 | 5/1982 | Fielden | 324/110 |
| 4,420,721 | 12/1983 | Dorey et al. | 324/110 |
| 4,583,043 | 4/1986 | Phillips | 324/110 |
| 4,727,315 | 2/1988 | Jones | 324/110 |
| 4,843,310 | 6/1989 | Friedl | 324/127 |

FOREIGN PATENT DOCUMENTS

| 0084634 | 8/1983 | European Pat. Off. | 324/110 |
| 0085769 | 8/1983 | European Pat. Off. | 324/110 |
| 208365 | 12/1923 | United Kingdom. | |
| 357221 | 9/1931 | United Kingdom. | |
| 691299 | 5/1953 | United Kingdom. | |
| 2183348 | 6/1987 | United Kingdom. | |

Primary Examiner—A. D. Pellinen
Assistant Examiner—David Osborn
Attorney, Agent, or Firm—John S. Hale

[57] ABSTRACT

An apparatus for detecting illegal tampering with an electricity meter which is adapted to record the amount of electricity supplied to the meter through cables has a first signal generating sensing coil situated externally of, and upstream of, the meter which generates a first signal representative of the current flowing through one of the supply cables and a second signal generating second sensing coil, located within the meter, which generates a second signal representative of the amount of electricity to be recorded by the meter. A Monitoring device monitors the first and second signals and produces a third actuation signal when one of the first and second signals differs from its correct value as a result of tampering. The first and second signals charge and discharge a capacitor. When the voltage on the capacitor reaches a predetermined level, the third signal, which may cause the load to be disconnected or may produced a warning, is generated.

4 Claims, 5 Drawing Sheets

Fig_3.

Fig_5.

Fig_6.

METER TAMPERING DETECTOR

BACKGROUND OF THE INVENTION

The present invention relates to electrical fault detecting devices, and in particular to such devices for use with a mains alternating current electricity supply.

The illegal tampering with electricity supplies to obtain electricity without cost, or at a reduced cost, is a widespread problem, particularly with respect to domestic electricity supplies. Three main methods of obtaining electricity illegally are used.

Firstly, the live or the live and neutral wires of the supply are bridged. This is done by connecting a pair of wires to the incoming supply wires and then bridging to the consumer fuse board, thereby by-passing current to the meter, causing it to under read. Secondly the live and neutral wires may be exchanged at the input to the meter, and the neutral can be switched to earth. Since the meter is driven normally by an inductive coil connected to the live cable only, this method again causes the meter to under read since the meter driving coil is only slightly energized. Thirdly, a device which supplies a small A.C. voltage directly to the meter can be connected, but in the opposite phase, thus causing the meter to wind backwards.

It is an object of the present invention to provide an apparatus for detecting when electricity is being abstracted illegally from the supply.

Thus, in accordance with the present invention, apparatus for detecting incorrect usage of an alternating current electricity supply comprises first signal generating means, disposed at a first location in the supply, for generating a first signal which varies with a property of the electricity supply in the vicinity of the first location, second signal generating means, disposed at a second location in the supply, for generating a second signal which varies with the property of the electricity supply in the vicinity of the second location and monitoring and actuator means adapted to monitor the two signals and to produce a third, actuating signal when the first and second signals are inconsistent with a correct electricity supply.

Preferably, the first and/or second signal generating means comprises a coiled portion of conductive leads forming part of the supply, and the signals comprise magnetic flux signals generated by the passage of current. The monitoring device may comprise a detecting coil adapted and positioned to detect flux produced by one or both of the first and second coiled portions. Preferably, the currents carried by the conductive leads are in antiphase.

In a correctly-used electricity supply, the live and neutral currents are exactly in antiphase, and thus the detecting coil described above would only detect a negligible amount of flux, since the flux induced by the live and neutral coils would cancel each other out. However, when one of the above three methods of illegal abstraction of electricity is used, the amplitude of the live and neutral signals is no longer equal, producing a net field which is detected by the detecting coil. The signal thus induced in the detecting coil is used to actuate the indicating means to indicate that illegal abstraction of electricity has occurred.

In a preferred embodiment, the first and second inductive coils and the detecting coil are mounted on a common core, preferably a ferrite core. Advantageously, signals from the detecting coil are amplified by an amplifier before being used to actuate the indicating means.

Preferably, the apparatus further comprises a field effect transistor, the actuating signal being fed to the gate of the field effect transistor. Advantageously, the gate of the field effect transistor is actuated by means of a capacitor charged by the signal from the detecting coil. The effect of this is that temporary, accidental aberations in the electricity supply do not actuate the indicating means.

The indicating means may, for example, comprise a light source, which is preferably extinguished in response to an actuating signal from the detecting coil, or may comprise an electrically-actuable counter or meter, for example an electronic counter.

In another embodiment, the first and/or second signal generating means may comprise detecting coils located around a respective conductive lead of the electricity supply, the first and second signals comprising the electrical signals induced in the coils by the passage of current through the leads.

Instead of balancing the flux produced by coils of the actual input cable, electrical signals produced as a result of the passage of electrical current are balanced against each other continuously. Any tampering with the supply between the first and second coils causes an imbalance in the electrical signals produced thereby, and this imbalance is used to actuate the indicator means. The apparatus is of particular benefit when one of the coils is situated at the entry point of the electrical cable into a dwelling and the other coil is situated within the meter housing. This is particularly advantageous since most illegal abstraction of electricity involves forming a bridge between the input and output cables of the electricity meter. The apparatus in accordance with the second aspect of the present invention would detect any such interference.

SUMMARY OF THE INVENTION

Preferably, the apparatus comprises two comparators for comparing the signals, the output of each comparator being connected to the indicator means.

Preferably, the output of each comparator is connected to the indicator means via a blocking diode.

The indicator means may, for example, comprise an electrically actuable counter or meter, for example, an electronic counter, which thus indicates the length of time for which illegal abstraction of electricity has occurred.

Preferably, the signals produced in each of the first and second coils is rectified to form D.C. voltages which are then compared.

As well as so-called electrical interference, which involves making electrical connections, for example to bypass the meter, a further method of illegally abstracting electricity is to interfere with the meter itself, or so-called mechanical interference. A conventional electricity meter comprises a rotatably mounted disc which is driven by an induction coil through which the live supply passes. Thus, as electric current passes through the meter, the meter disc rotates, and the rotations of the meter disc are counted by a conventional mechanical, or more recently electronic, counter, thus giving a reading of the total amount of electricity supplied. However, if rotation of the meter disc is stopped or slowed down, the meter will read much less than it ought to, and consequently the consumer will pay less.

Thus, in another embodiment, the second signal generating means comprises means for producing a signal which varies with the rotation of an electricity meter disc whose rotational speed varies with the electricity supply under normal operating conditions.

In this way, under correct operating conditions, the apparatus effectively checks whether the rotational speed of the meter disc is correct for the amount of electricity passing into the meter, and if this is found to be incorrect the tamper indicating means is actuated by the actuating means.

In a preferred embodiment, the actuating means comprises a capacitor, the signal from the coil acting to charge the capacitor up to an actuating voltage, and the signal from the detecting means acting so as to limit the charge on the capacitor to a level lower than the actuating voltage, thereby rendering the capacitor inactive under correct operating conditions.

In one embodiment, the detecting means comprises a light source and a light sensitive element, either disposed upon opposite sides of the disc which is provided with through apertures, or arranged such that the light sensitive element receives light reflected from reflecting portions situated on the disc. In either case, a pulsed signal is produced by the light sensitive element, which is used to limit the maximum voltage on the said capacitor.

The tamper indicating means may, for example, comprise an electrically-actuable counter, such as an electronic counter, and/or may comprise a light emitting diode which is arranged to light or extinguish, as desired, under conditions of illegal abstraction of electricity.

The present invention further provides apparatus for determining incorrect usage of an alternating current electricity supply, comprising first and second coils formed by coiling live and neutral supply cables respectively to form first and second magnetic flux signals which vary with the electricity supply in the live and neutral cables respectively, a magnetic flux detecting coil magnetically coupled to the first and second inductive coils to detect flux produced thereby, and indicating means responsive to an actuating signal induced in the detecting coil and actuable when the flux detected by the detecting coil induces an actuating voltage therein.

The present invention further provides apparatus for determining incorrect usage of alternating current electricity supply, comprising a first coil disposed in relation to a mains input cable to have induced therein a first electrical signal upon passage of current through the cable, a second coil disposed in relation to a mains input cable to have induced therein a second electrical signal upon passage of current through the cable, comparator means for comparing the said first and second electrical signals and indicator means actuable by an imbalance of said first and second signals.

The present invention further provides apparatus for determining incorrect usage of an alternating current electricity supply, comprising a coil adapted to have induced therein a signal which varies with the passage of current through the cable, detecting means for producing a signal resulting from the rotation of a disc forming part of an electricity meter, and which signal varies with the rotational speed of the disc, tamper indicating means and actuating means for actuating the tamper indicating means, the signals from the coil and from the detecting means acting in opposite senses on the actuating means to render it inoperative under correct operating conditions, but to operate it and actuate the tamper indicating means when the signal received from the detecting means is insufficient to counteract the effect on the actuating means of the signal from the coil.

BRIEF DESCRIPTION OF THE PREFERRED EMBODIMENTS

By way of example only, specific embodiments of the present invention will now be described, with reference to the accompanying drawings;, in which.

DESCRIPTION OF THE PREFERRED EMBODIMENTS

Figure 1:
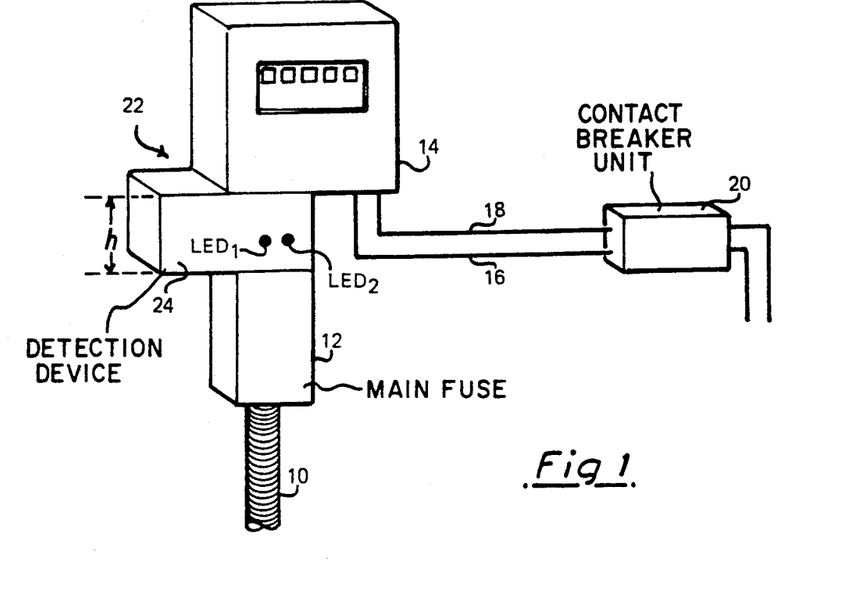
FIG. 1 is a view of an embodiment of device in accordance with the present invention, fitted to a domestic mains electricity supply unit.

Referring firstly to FIG. 1, a domestic mains electricity supply unit comprises an incoming mains cable 10 which feeds current via a main fuse 12 (usually rated at 60 A or 100 A) into an electricity meter 14. Output leads 16, 18 feed the metered current into the property, via a fuse box or contact breaker unit 20. The device 22 in accordance with the first embodiment of the present invention is situated in use between the main fuse 12 and the meter 14. Externally, it comprises a cuboidal box 24 having two apertures to allow two light emitting diodes LED1, LED2 within the device to be visible therethrough. Also, there is an aperture in the face of the box adjacent to the main fuse 12 and another aperture in the face of the box adjacent the meter 14, to allow electric cable to pass into and out of the box. The height h of the box is such that it is a snug fit between the main fuse 12 and the meter 14, abutting each of them when in use, thereby preventing access to the electricity supply between the main fuse 12 and the meter 14. The box 24 itself is encased in a tough transparent resin, e.g. epoxy resin, the apertures for the LEDs thereby being closed off, but the LEDs are still visible through the resin.

The two LEDs are provided to enable the state of the system to be evaluated very simply, as will be explained. LED 1 is intended to be permanently lit, in order to indicate that the device 22 is operating correctly. LED2 is normally lit, but is extinguished if some fault is present in the system, for example, if the supply has been tampered with or if a genuine fault is present in the supply.

Figure 2:
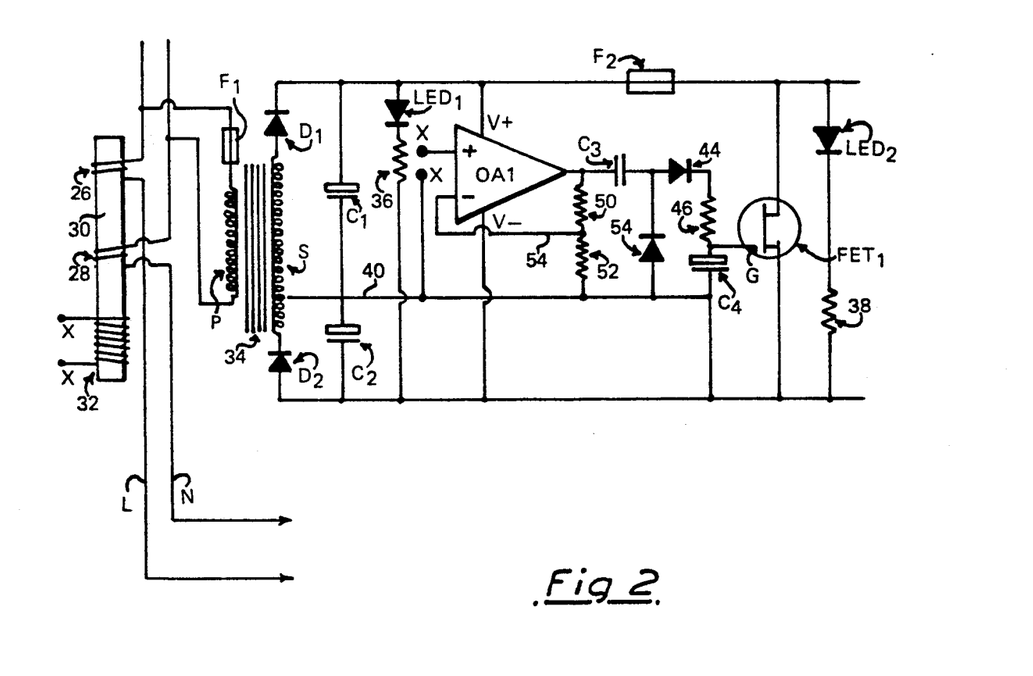
FIG. 2 is a circuit diagram showing the construction of the device of FIG. 1.

The construction of the device is shown in FIG. 2. The incoming mains lead 10 comprises an insulated live cable L and a neutral cable N, each of 16 mm$^2$ cross-section. Each of these cables is formed into a respective coil 26, 28 of a single turn each about an electromagnetic core 30 in the form of an elongate, cylindrical soft iron bar. A third, detecting, coil 32 comprising 200 turns of insulated 18 SWG wire is also provided on the core 30.

The primary coil P of an iron-core transformer 34 is connected via a 1 A quick blow fuse $F_1$ across the live and neutral cables L, N of the incoming mains supply. The current induced in the circuit connected to the secondary coil S of the transformer 34 is substantially half-wave rectified by means of two Type BY 126 diodes $D_1$, $D_2$, and the current is fed to a 1.4 V light emitting diode $LED_1$ in series with a 2 k$\Omega$, 0.5 W resistor 36 connected across the secondary coil S. The $LED_1$ is thus always lit whenever current flows in the incoming mains supply. Capacitors $C_1$ and $C_2$, each being 470 $\mu$F, 40 V capacitors, are also connected across the secondary coil, with a view to smoothing out the rectified signal.

A second light emitting diode $LED_2$ is also connected across the secondary coil S, the $LED_2$ being connected in series with a 2 k$\Omega$, 0.5 W resistor 38 and 100 mA quick blow $F_2$. Thus, $LED_2$ is also always lit, whenever current flows in the incoming mains supply and whenever fuse $F_2$ has not blown.

A depletion mode metal oxide semiconductor field effect transistor $FET_1$ is also connected across the secondary coil S of the transformer 34 between the fuse $F_2$ and the second $LED_2$. This is normally held open by the gate G to which no voltage, or an insufficient voltage to close it, is applied, as will be explained.

A Fairchild Type 741 operational amplifier $OA_1$ is provided, and one output X from the detecting coil 32 is connected to the non-inverting input thereof. The other output X of the detecting coil 32 is connected to the secondary coil S along a return lead 40. The actual position of the connection of the return lead 40 on the secondary coil is determined during the construction of the circuit, and is that position where the output of the amplifier is zero for zero input. The power of the operational amplifier is provided by connections to the V+ and V− connections which are connected across the secondary coil S.

The output of the amplifier $OA_1$ is connected via a 0.01 $\mu$F 100 V capacitor $C_3$, a type IN 1418 diode 44 and a 1 M$\Omega$ 0.5 W resistor 46 to a 47 $\mu$F 25 V Tantilum capacitor $C_4$, the other side of the capacitor being connected to the diode $D_2$. The gate G of the $FET_1$ is connected between the resistor 46 and the capacitor 48.

The output of the amplifier OA is also connected by means of the return lead 40 to the secondary coil S via a 100 k$\Omega$ 0.5 W resistor 50 and a 1 k$\Omega$ 0.5 W resistor 52. A feedback loop 54 leads from between the two resistors 50 and 52 into the inverting input of the operational amplifier $OA_1$. The return lead 40 is also connected to the output of the amplifier in between the capacitor 42 and the diode 44 via a type IN 1418 diode 54.

In normal operation, the magnetic fluxes produced by the coils 26, 28 cancel each other out, since the currents in the two coils are in antiphase. Thus, the current induced in coil 32, which is wound on the same core as the coils 26, 28 will be zero or negligible. Thus, the input into the operational amplifier $OA_1$ will be zero or negligible. The result of this is that the output of the operational amplifier will also be zero or negligible, but will certainly not supply a sufficiently large voltage to capacitor $C_4$ to render the field effect transistor $FET_1$ conductive. Thus, both light emitting diodes $LED_1$, $LED_2$ will be lit during normal operation.

If it is attempted to obtain electricity illegally by interferring with the supply leads L, N then the flux created in the core 30 by the leads 26, 28 connected to the live and neutral leads L, N respectively will not be exactly equal in amplitude, and hence a net flux will be created. The net flux will be detected by the detecting coil 32, in which a current will be induced. The induced current is amplified by the operational amplifier $OA_1$ whose output charges the capacitor $C_4$ controlling the gate of the field effect transistor FET. When the capacitor $C_4$ has reached a certain voltage (approximately 4 V) the gate of the field effect transistor is actuated, thus causing the field effect transistor to assume a conducting state. A large current thus flows through the transistor, causing the fuse F2 to blow, and thus extinguishing the second light emitting diode $LED_2$. Thus, when tampering with the supply has occurred, only the first light emitting diode $LED_1$ is lit, the other light emitting diode $LED_2$ being extinguished and thus indicating that tampering with the supply has occurred.

The values of the capacitor $C_4$ and resistor 46 are chosen such that the capacitor does not charge sufficiently to actuate the gate G of the field effect transistor FET until several seconds (approximately 7 or 8 seconds) have elapsed. This ensures that very short-lived changes in the electricity supply (e.g. a spike in the waveform or an accidental grounding by a consumer) do not cause the FET to conduct and do not extinguish the second light-emitting diode $LED_2$. Only when a relatively long-lived or permanent interference has occurred will the second light emitting diode $LED_2$ extinguish. The values of the capacitor $C_4$ and resistor 46 can be varied to vary the time required for the actuation of the gate. This period can be anything up to, for example, one minute.

This apparatus also has the advantage that if there is a relatively large, accidental leakage of current to earth, causing an imbalance in the current in the live and neutral leads, then this will cause the second light emitting diode $LED_2$ to extinguish, since the imbalance will be detected by the detection coil 32. Thus, a consumer or an electricity supply official will be aware that a potentially dangerous fault exists and can take action to rectify it.

Figure 3:
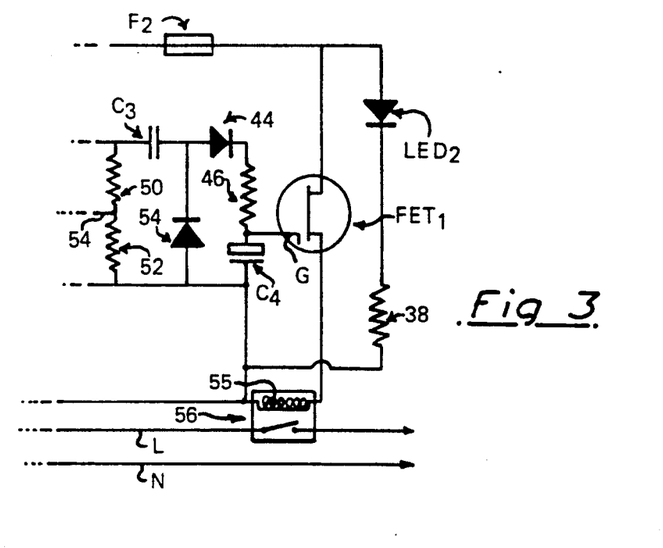
FIG. 3 is a portion of a circuit diagram showing a modification to the circuit of FIG. 2.

A modification of this embodiment is illustrated in FIG. 3. The modified apparatus is almost identical to that shown in FIGS. 1 and 2, and only the modified part is shown, with identical components being identified with the same reference numerals as those shown in FIG. 2. The modification involves connecting the actuating coil 55 of a conventional solenoid trip with 56 in the line leading from the FET1 to the secondary coil S of the transformer, the trip unit 56 being connected to the live input lead L of the electricity supply.

The operation of the FIG. 3 embodiment is almost identical to that of the first embodiment. Under correct operating conditions, the detecting coil 32 will detect a zero or negligible magnetic flux, and thus the output signal from the amplifier OA1 will be zero or negligible, as will the charge on the capacitor $C_4$. Thus, the FET1 will normally be open and will therefore be non-conductive. The $LED_2$ will thus still be lit, but no current will flow through the actuating coil of the solenoid trip 56.

Under incorrect operating conditions, the capacitor $C_4$ will become charged, and eventually will cause the FET1 to become conductive as in the first embodiment. The current which flows through the FET will also flow through the coil 55 and thus will actuate the solenoid trip unit 56, cutting off the electricity supply. Also, the large current through the FET1 will cause the fuse $F_2$ to blow, thus extinguishing the LED2 and giving a visual indication that the supply is incorrect, even if no electricity is being drawn from the supply.

Figure 4:
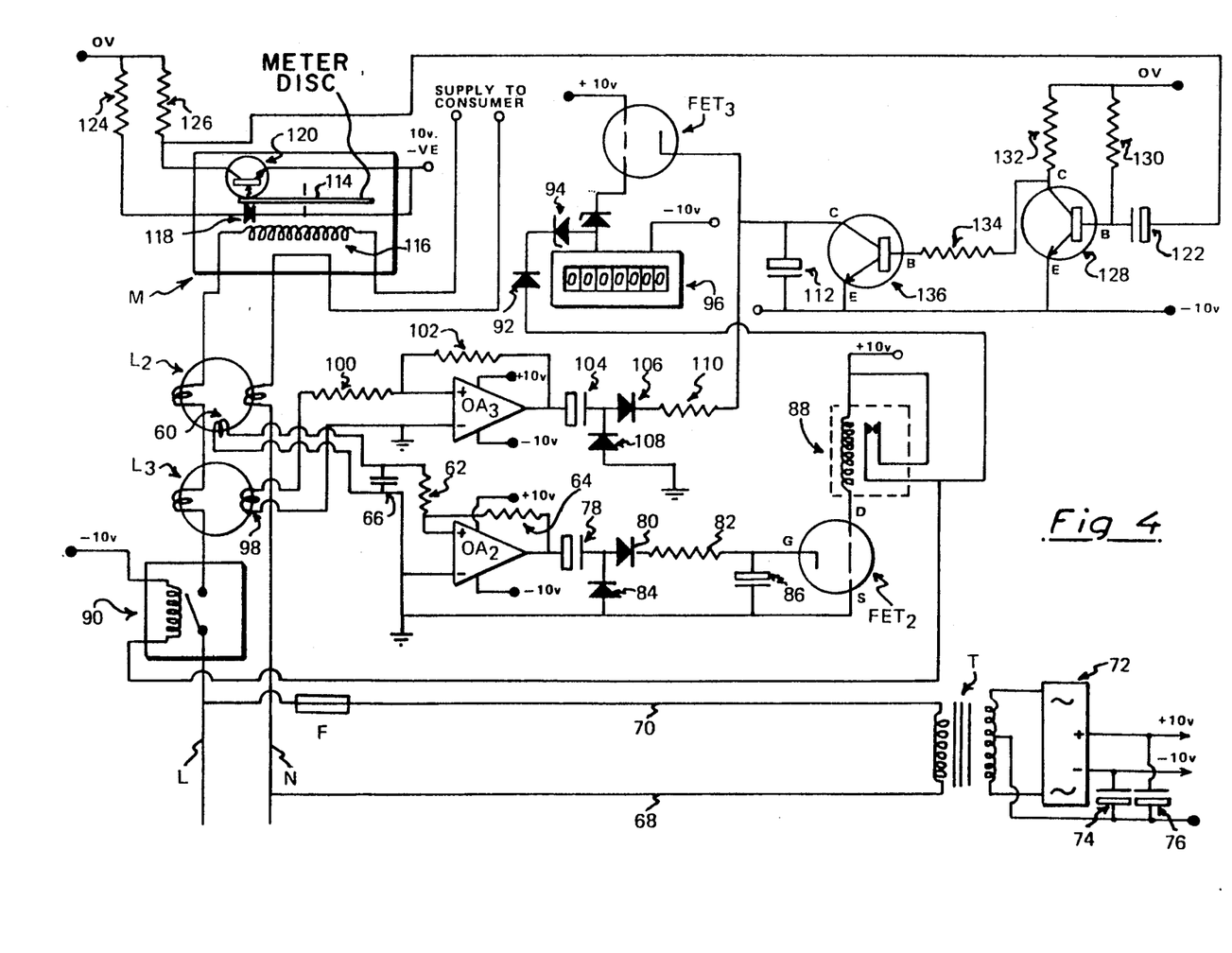
FIG. 4 is a circuit diagram showing the construction of a further embodiment of device in accordance with the present invention.

A further embodiment of the present invention is illustrated in FIG. 4. This embodiment has the advantage that not only does it detect electrical interference, but it also detects so-called mechanical interference, i.e. interference with the meter itself to stop or reduce its rotation so that it gives a lower reading than it should. The two types of tampering with the supply will hereinafter be referred to as "electrical interference" and "mechanical interference" respectively.

As in the first embodiment, the supply is provided along live and neutral leads L, N. Dealing firstly with electrical interference, each input lead L, N is coiled once around a first common ferrite core $L_2$ so that the magnetic flux produced by the two coils cancel each other out under normal operating conditions. As in the first embodiment, a detection coil 60 formed by 150 turns of insulated SWG 18 wire is formed about the ferrite core $L_2$. The output from the detection coil 60 is fed into a type 741 operational amplifier $OA_2$, the inverting input of the operational amplifier also being connected to earth. The input to the non-inverting input is fed through a 100 k$\Omega$ resistor 62 and a feedback loop extends between the output and the non-inverting input of the amplifier via a 1M$\Omega$ resistor 64. A 0.01 $\mu$F capacitor 66 is connected across the output of the detecting loop 60 to remove any effects resulting from radio interference which might otherwise produce spurious signals. The operational amplifier is powered by a 10 V input obtained by connecting leads 68, 70 across the input leads L, N and to a transformer T and a bridge rectifier 72. Two 470 $\mu$F 25 V capacitors 74, 76 extend between the negative output and ground and the positive output and ground to smooth the rectified signal.

The output of the amplifier $OA_2$ is connected via a 1.5 $\mu$F tantalum capacitor 78, a IN 1418 diode 80 and a 100K$\Omega$ resistor 82 to the gate G of an N-channel power metal oxide semiconductor field effect transistor (MOSFET) $FET_2$. A further IN 1418 diode 84 and a 47 $\mu$F tantalum capacitor 86 are connected to ground from in between the capacitor 78 and diode 80 and from in between the resistor 82 and gate G respectively.

In normal use, the flux produced in the core $L_2$ by the coils of the live L and neutral N cables amounts to zero, since the two coils produce equal and opposite fluxes. Thus, the detection coil 60 has no current induced in it, and consequently the output of the amplifier $OA_2$ is zero and the gate G of the field effect transistor $FET_2$ is not actuated. Even if the fluxes produced by the coiled live L and neutral N wires do not exactly cancel each other out, resulting in a small induced current in the detection coil 60, the output of the amplifier $OA_2$ will not be sufficiently large to actuate the gate G.

If, however, electricity is illegally abstracted, the fluxes produced by the live L and neutral N coils in the core $L_2$ are no longer in balance, and a current is induced in the detection coil 60. The induced current is amplified and charges the capacitor 86. When a sufficient voltage (4 V) is on the capacitor, the gate G of the field effect transistor FET is actuated, thus rendering the transistor conductive. (As before, the values of the resistor 82 and the capacitor 86 are chosen such that the capacitor takes about 9 or 10 seconds to reach the voltage required for actuating the gate G, thus preventing actuation of the gate G as a result of short-lived spikes or other temporary abberations in the supply). As before, the values of the capacitor 86 and resistor 82 may be varied to vary the period required to actuation of the gate.

When the field effect transistor $FET_2$ is rendered conductive, a relay 88, which is normally open, closes and supplies a 20 V signal to a solenoid trip unit 90 located in the live supply lead L, thus cutting off the normal supply to the meter M. At the same time, the relay connects the +10 V supply via a BY126 diode 92 and a 9 V 1 W Zener diode 94 to an electronic counter 96 which is already connected to a $-10$ V supply. The 20 V supply thus activates the counter 96 which is conventional and which advances one unit every 36 seconds. The counter 96 thus gives an indication of for how long illegal abstraction of electricity has occurred. Since the live lead L is now effectively disconnected from the meter M, there will always be a net flux induced in the coil $L_2$ by the neutral wire coil, and consequently the detection coil 60 will continuously supply a signal to the amplifier $OA_2$, thus continuously actuating the gate G. Thus, once the solenoid trip unit 90 is actuated, any use of electricity is noted on the electronic counter 96.

Turning now to mechanical interference, in order to detect this it is necessary to have means for detecting rotation of the meter disc and means for detecting the input of electricity. The input means comprises a single turn of the input live lead L around a further ferrite core $L_3$. A detecting coil 98 of 100 turns of insulated SWG 18 wire is also wound onto the core $L_3$, and is connected to the inputs of a type 741 operational amplifier $OA_3$. The inverting input of the amplifier is also connected to earth and a 100 k$\Omega$ resistor 100 is located between the detection coil 98 and the non-inverting input. A IM$\Omega$ resistor 102 is provided in a feedback loop to the non-inverting input, to provide a gain of 10 in the amplifier. The power for the amplifier is obtained from the bridge rectifier unit 72.

The output of the amplifier is fed to a D.C. block in the form of a 1.5 $\mu$F tantalum capacitor 104 and thence to a bridge rectifier in the form of two IN 1418 diodes 106, 108, diode 106 being connected in series with the capacitor 104 and the other diode 108 being connected to ground. A 5 k$\Omega$ resistor 110 is connected in series with the capacitor 104 and leads to the gate G of a metal oxide semiconductor field effect transistor $FET_3$. The resistor is also connected to a 22 $\mu$F tantalum capacitor 112.

Thus, since only the live input lead L is coiled around the core $L_3$, the detection coil continually produces a current which is amplified, rectified and fed to the capacitor 112. In the absence of any other apparatus, the capacitor 112 would quickly reach a voltage at which the gate G of a field effect transistor $FET_3$ would be actuated, thus rendering the transistor conductive. In this state, a +10 V input is supplied to the electronic counter 96 which is already connected to a $-10$ V supply and the counter thus advances one unit every 36 seconds, as before. However, the capacitor 112 is not normally allowed to reach the actuating voltage as will now be explained (it would normally take about 9 to 10 seconds so to do, and the values of the resistor 110 and the capacitor are chosen accordingly).

Figure 5:
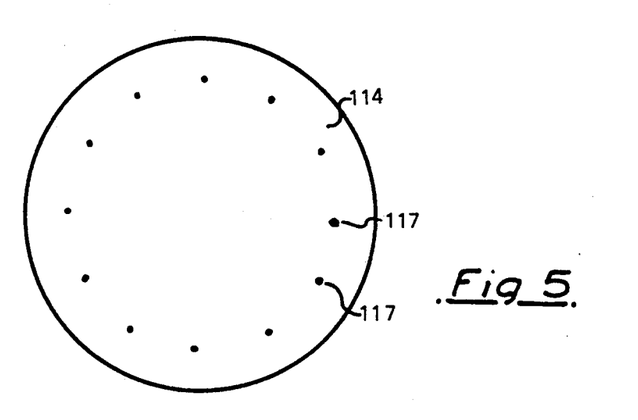
FIGS. 5 and 6 are plan views of alternative meter discs for use with the embodiments of FIGS. 4, 7, 8 and 9.

The conventional electricity meter M comprises a rotatably mounted disc 114 which is rotated in the normal way as a result of input current passing through an inductive coil 116 of the live lead L. The disc 114 is provided with a plurality of equally angularly spaced through apertures 117 (see FIG. 5) and an opto-electronic coupling device is provided, comprising a light emitting diode 118 on one side of the disc and a phototransistor 120 on the opposite side of the disc. Under normal circumstances, as the meter disc 114 rotates and the light path between the light emitting diode and the photo transistor is alternately blocked and opened, the phototransistor 120 outputs a pulsed, flip-flop signal, which is connected to a 10 microfarad tantalum capacitor 122. (The 10 volt supply from the bridge rectifier 72 is used to power the LED 118 and is also connected across the phototransistor 120, each one via respective 1.5 k$\Omega$ resistor 124, 126).

The capacitor 122 is connected to the base of a BC 171 npn transistor 128. The base B and the collector C are each connected to ground by means of a 100 k$\Omega$ resistor 130 and a 5.6 k$\Omega$ resistor 132 respectively, the emitter E being connected to a $-10$ V supply supplied from the bridge rectifier 72. The collector C of the transistor 128 is also connected, via a 100 k$\Omega$ resistor 134 to the base B of a second BC 171 npn transistor 136. The collector C of the transistor 136 is connected to one side of the aforementioned 10 microfarad capacitor 112, the other side of the capacitor 112, and the emitter E of the transistor 136, being connected to the $-10$ volt supply.

The pulsed flip-flop signal fed into the capacitor 122 from the phototransistor 120 momentarily removes the bias voltage from the base of the first transistor 128 when the phototransistor 120 detects light from the light emitting diode 118. The transistor 128 then switches off and its collector voltage rises sharply to 10 volts. Shortly afterwards, when the phototransistor 120 no longer detects the light emitting diode 118, a signal is no longer fed to the capacitor 112, and the capacitor therefore discharges via resistor 130, causing the transistor 128 to switch off, the collector voltage thereby falling to zero. This rising and falling of the collector voltage depends upon the rotational speed of the meter disc 114. The 10 V pulses formed at the collector C of the transistor 128 are fed via the current limiting resistor 134 to the base B of the second transistor 136, and during the pulses the transistor 136 is thereby switched on. As the transistor 136 is switched on, the collector voltage falls to zero, and the capacitor 112 which has previously been slightly charged as a result of the coil 98 about the core L3, discharges, and does not have the time to charge to the value required to actuate the field effect transistor FET$_3$. Thus, as the coil 98 attempts to charge up the capacitor 112, the circuitry leading from the meter disc periodically discharges the capacitor 112, assuming the meter disc is rotating. Thus, during normal operation, the capacitor 112 cannot charge to a value sufficient to actuate the field effect transistor FET$_3$.

If the disc in the meter is stopped by external interference, the amplifier OA$_3$ amplifies the signal from the coil 98 and acts to charge the capacitor 112, as described before. However, if the meter is no longer rotating or is rotating too slowly, no pulses, or insufficient pulses will be fed into the transistor 128 and there to the transistor 136, and the capacitor 112 will thereby be able to charge to a value (approximately 4 V) whereupon the field effect transistor FET$_3$ will switch on and supply voltage to the electronic counter 96, which, as before, advances one unit every 36 seconds. This gives a visual indication as to for how long interference with the supplier has occurred.

Figure 6:
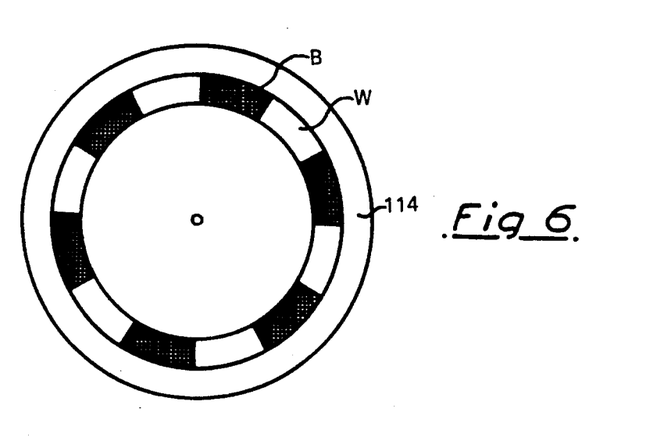

Instead of having holes in the meter disc, it would be possible to print alternate black and white portions B,W (FIG. 6) onto the disc and use a reflective type optocoupler with the light from LED 118 being projected towards the black and white portions and the photometer 120 being aligned to receive light reflected from the white portions W. This would also result in a flip-flop signal whose frequency varied with the speed of the disc. Alternatively, the output from FET$_3$ may used to fire a solenoid trip to cut off the supply to the consumer in the event that it is attempted to abstract electricity illegally.

Figure 7:
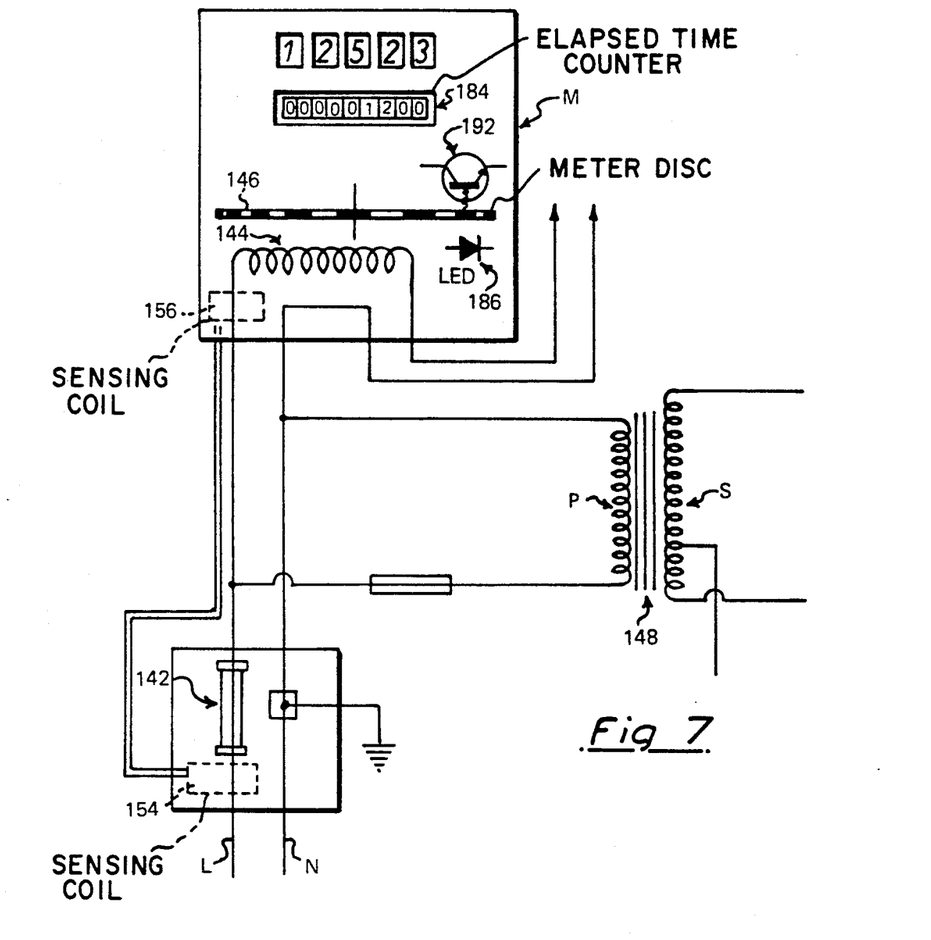
FIG. 7 is a schematic view of a third embodiment of device in accordance with the present invention.
Figure 8:
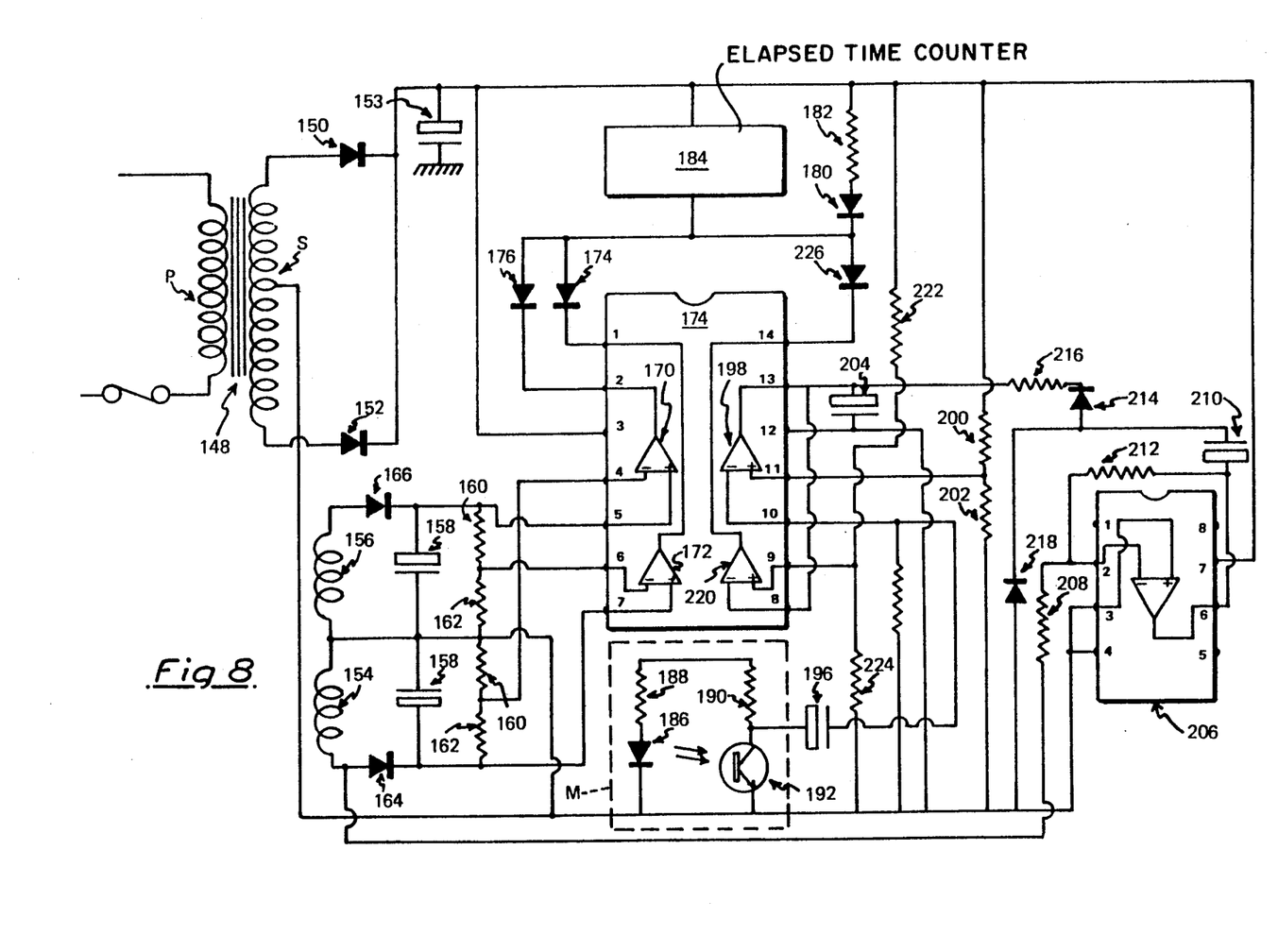
FIG. 8 is a circuit diagram of the embodiment of FIG. 4.

A further embodiment of the present invention is illustrated in FIGS. 7 and 8 of the accompanying drawings.

As in the second embodiment, the incoming mains supply comprises live and neutral cables L, N. The live cable leads, via a main fuse 142 to a coil 144 which drives a rotatably mounted disc 146 of a meter M. This is shown schematically in FIG. 7. The incoming mains supply cables are tapped and fed to a centre-tapped step-down transformer 148. Opposite sides of the secondary coil S are connected to rectifying diodes 150, 152 to supply a low-voltage electricity supply for the components to be hereinafter described. As seen in FIG. 8, the two diodes 150, 152 are connected to earth via a 470 $\mu$F, 25 V D.C. smoothing capacitor 153.

A first detecting coil 154 comprises two hundred turns of insulated SWG 18 wire wound around a ferrite core, located before the main fuse 142. A second detecting coil 156 is located within the meter housing, and is of identical construction to the first detecting coil 154. The electrical construction of this embodiment is shown in FIG. 8. Connected across each detecting coil is a 0.33 $\mu$F tantalum capacitor 158 and two 0.25 W resistors 160, 162 of 100 K$\Omega$ and 220 K$\Omega$ value respectively. The two coils 154, 156 are also connected in series with each other, and two type IN 4148 rectifying diodes 164, 166 are connected to each of the detecting coils 154, 156 in the leads remote from the common lead 168 connected to each of the coils 154, 156. The full voltage produced across each of the detecting coils 154, 156 is fed in to the non-inverting input of a respective comparator 170, 172 of a type LM 339 integrated circuit 174. The voltage from between each pair of resistors 160, 162 is fed to the inverting input of the comparator associated with the opposite detecting coil. Under normal circumstances, the voltage at each non-inverting input will be greater than that at the associated inverting input, so that the output of the comparator would also be high. However, the output of the comparators 170, 172 is blocked by a respective type IN 4148 blocking diode 174, 176.

If the mains supply is by-passed across either of the coils 154, 156, or if the wires connecting the two coils are cut or short-circuited, then the voltage at the inverting input becomes greater than that at the non-inverting input. Current will be drawn through pin 1 of the comparator unit 174 if the first coil 154 is bridged and will be drawn through the other diode 176 if the second coil 156 is bridged. Thus, an imbalance is produced which causes an LED 180 (connected to the voltage supply via a 0.5 W 1.5 K$\Omega$ resistor 182) to light up. Moreover, an elapsed time-counter 184 is also actuated, the counter being identical to that of the second embodiment, and advancing one unit every thirty-six seconds elapsed.

Thus, if it is attempted to abstract electricity illegally by bridging the supply, the elapsed time-counter 184 is actuated and the LED 180 also lights, indicating to the consumer that the tampering has been detected.

Turning now to the mechanical interference with the meter, as in the second embodiment, a light emitting diode 186 is provided on one side of the meter disc 146 in series with a 0.5 W 1.5 KΩ resistor 188, the LED 186 being connected in series with a 0.25 W 27 KΩ resistor 190 and a phototransistor 192. As in the second embodiment, the meter disc 146 is provided with a plurality of through apertures, which produces a pulsed signal at the collector C of the phototransistor 192. The meter disc is identical to the meter disc 114 of FIG. 5. Also, the arrangement may be replaced with the reflective arrangement as described above and as illustrated in FIG. 6.

The collector of the phototransistor 192 is connected via a 0.68 μF tantalum capacitor 196 to the inverting input of a further comparator 198 in the integrated circuit 174. A reference voltage, produced by a potential divider formed by a 0.25 W 32 KΩ resistor 200 and a 0.25 W 10 KΩ resistor 202 connected across the voltage supply is fed into the non-inverting input of the non-inverting input of the comparator 198. A clamping action is thus produced on pin 13 of the comparator unit 174.

A 47 μF tantalum capacitor 204 is connected to the pin 13 (i.e. the output of comparator 198), and also to pin 12 of the comparator unit 174. Under normal circumstances, the capacitor 204 will not charge because its positive plate is connected to pin 13. Thus, every time a positive pulse is produced by the phototransistor 192 as a result of the rotation of the meter disc M, the voltage of the positive plate of the capacitor 204 is clamped to 0.6 V.

A sample of the signal from the detecting coils 154, 156 is fed into the inverting input of a type C741 operational amplifier 206 via a 0.25 W 10 KΩ resistor 208. A reference voltage from the secondary coils S of the centre-tapped transformer 148 is fed into the non-inverting input of the amplifier, and also as a power supply to pin 4 of the amplifier. A power lead is also connected to pin 7 of the amplifier.

The output from pin 6 is fed to a 10 μF tantalum capacitor 210, and a 0.25 W 68 KΩ resistor 212 bridges the inverting input and the input to the capacitor 210. The capacitor 210 is connected via a IN 4148 diode 214 and a 0.25 W 120 KΩ resistor 216 to the positive plate of the aforementioned capacitor 204 and pin 13 of the comparator unit 174. The capacitor 210 is also connected to the power supply from the centre-tapped secondary coil S via a type IN 4148 diode 218.

The sampled signal from either or both of the detecting coils 154, 156 is amplified by the operational amplifier 206 and rectified by the two diodes 214, 218. The capacitor 210 blocks any direct current from the output (pin 6) of the operational amplifier 206 in standby mode.

The resistor 216 and the capacitor 204 form a long RC time constant, typically of 7 to 8 seconds. As stated previously, under normal conditions the capacitor 204 will not charge because its positive plate is clamped to the output voltage of 0.6 volts on pin 13 every time the meter disc produces a pulse. However, when the meter disc is not running, due to interference, then no clamping pulses are produced at pin 13. Capacitor 204 thus charges rapidly, and its voltage is fed to the inverting input of a further comparator 220 in the comparator unit 174. The non-inverting input of the comparator 220 is fed with a reference voltage produced by a 0.25 W 220 KΩ resistor 222 and a 0.25 W 120 KΩ resistor 224 connected in series across the voltage supply. As the voltage at the positive plate of the capacitor 204 exceeds the reference voltage at the non-inverting input (approximately 4 V), the comparator 220 is actuated. Pin 14 of the comparator unit 174 thus draws current through a further type IN 4148 diode 226, causing the LED 180 to light, and also actuating the electronic clock counter 184 are previously described.

Thus, any interference, be it mechanical or electrical, to the incoming mains supply causes the light emitting diode 180 to light, and also causes the electronic clock counter to advance. Thus, it is possible to the estimate the total time elapsed during which illegal abstraction of electricity has occurred, and upon inspection by an official of the electricity supply company, the bill submitted to the consumer may be adjusted accordingly.

Figure 9:
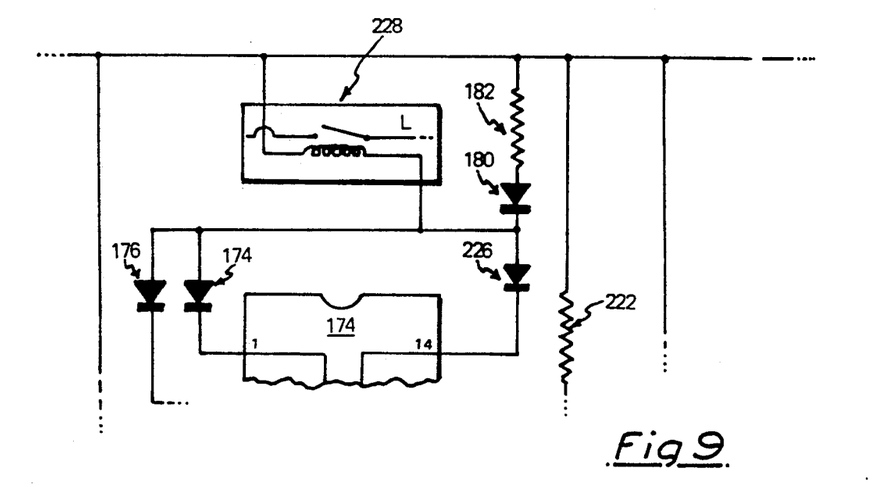
FIG. 9 is a portion of a circuit diagram showing a modification of the circuit of FIG. 8.

A modification of this embodiment is shown in FIG. 9, in which the electronic clock counter 184 is replaced with a conventional solenoid trip unit 228, identical to the solenoid trip unit 56 of FIG. 3. Thus, when electricity is supplied incorrectly, instead of the counter 184 registering the time for which incorrect use occurs, the solenoid trip unit opens and cuts off the entire electricity supply. As illustrated, the solenoid trip unit is connected in the live cable L, but for the sake of clarity in the drawing this is shown schematically rather than illustrating the actual connection in the live cable L.

In all the embodiments illustrated, instead of actuating an electronic clock-counter, the signal which would normally actuate the counter may be used to turn off the incoming electrical supply. For example, that signal may be connected to the base of a solenoid trip triac or other cut-out device which is inserted in the incoming mains supply. Production of a current at the base would thus switch off the triac and switch off the main supply.

The invention is not restricted to the details of the foregoing embodiments.

We claim:

1. Apparatus for detecting illegal tampering with an electricity meter which is adapted to record the amount of electricity supplied to said meter through cable means, the apparatus comprising:

a first signal generating means, situated externally of and upstream of said meter and adapted to generate a first signal which is representative of the current flowing through said cable means at a location outside said meter, in the vicinity of the first signal generating means;

a second signal generating means, situated within said metering device, and adapted to generate a second signal which is representative of the amount of electricity recorded by said meter;

a monitoring means adapted to monitor the first and second signals and to produce a third actuation signal when one of the first and second signals differs from its correct value as a result of tampering; and said monitoring means comprising a capacitor, a capacitor charging means to which one of said first and second signals is connected which acts to charge the capacitor, the other of said first and second signals being connected to capacitor decharging means, said capacitor's charge or voltage being a function of said first and second signals which controls the actuation of a switching device which in turn activates an indicating device when the charge or voltage on the capacitor reaches a predetermined value.

2. Apparatus for detecting illegal tampering with an electricity meter which is adapted to record the amount of electricity supplied to said meter through cable means, the apparatus comprising:
   a first signal generating means, situated externally of and upstream of said meter and adapted to generate a first signal which is representative of the current flowing through said cable means at a location outside said meter, in the vicinity of the first signal generating means;
   a second signal generating means, situated within said metering device, and adapted to generate a second signal which is representative of the amount of electricity to be recorded by said meter;
   a monitoring means adapted to monitor the first and second signals and to produce a third actuation signal when one of the first and second signals differs from its correct value as a result of tampering;
   said monitoring means comprising an actuating means adapted to produce said third signal, said actuating means comprising a capacitor, a capacitor charging means to which one of said first and second signals is connected and which acts to cause charging of the capacitor, and a capacitor discharging means to which the other of said first and second signals is connected and which acts to discharge the capacitor, said first and second signals acting upon the actuating means in opposite senses so that under normal conditions the actuating means does not produce said third signal but that when one of the first and second signals is sufficiently greater than the other of said first and second signals, the third signal is produced.

3. An electricity meter adapted to record the amount of electricity supplied to it through cable means, fitted with apparatus for detecting illegal tampering comprising:
   a first signal generating means, situated externally of and upstream of said meter and adapted to generate a first signal which is representative of the current flowing through said cable means at a location outside said meter, in vicinity of the first signal generating means;
   a second signal generating means, situated within said metering device, and adapted to generate a second signal which is representative of the amount of electricity recorded by said meter;
   a monitoring means adapted to monitor the first and second signals and to produce a third actuation signal when one of the first and second signals differs from its correct value as a result of tampering, said monitoring means comprising a capacitor whose charge or voltage is a function of said first and second signals, said capacitor being connected to a switching device which in turn controls the activation or deactivation of an indicating device when the charge or voltage on the capacitor reaches a predetermined value.

4. An electricity meter adapted to record the amount of electricity supplied to it through cable means, fitted with apparatus for detecting illegal tampering comprising:
   a first signal generating means, situated externally of said meter and adapted to generate a first signal which is representative of the current flowing through said cable means at a location outside said meter, in the vicinity of the first signal generating means;
   a second signal generating means, situated within said metering device, and adapted to generate a second signal which is representative of the amount of electricity to be recorded by said meter;
   a monitoring means adapted to monitor the first and second signals and to produce a third actuation signal when one of the first and second signals differs from its correct value as a result of tampering;
   said monitoring means comprising a capacitor, a capacitor charging means to which one of said first and second signals is connected and which acts to cause charging of the capacitor, and a capacitor discharging means to which the other of said first and second signals is connected and which acts to discharge the capacitor activating an indicating device when the charge or voltage on the capacitor reaches a predetermined value.

* * * * *